(12) United States Patent
Zhou et al.

(10) Patent No.: US 11,789,199 B2
(45) Date of Patent: Oct. 17, 2023

(54) CHIP HEAT DISSIPATION STRUCTURE AND LIQUID CRYSTAL DISPLAY DEVICE

(71) Applicant: WUHAN CHINA STAR OPTOELECTRONICS TECHNOLOGY CO., LTD., Wuhan (CN)

(72) Inventors: Zheng Zhou, Wuhan (CN); Suimang Song, Wuhan (CN)

( * ) Notice: Subject to any disclaimer, the term of this patent is extended or adjusted under 35 U.S.C. 154(b) by 486 days.

(21) Appl. No.: 16/972,622

(22) PCT Filed: Oct. 30, 2020

(86) PCT No.: PCT/CN2020/125292
§ 371 (c)(1),
(2) Date: Dec. 7, 2020

(87) PCT Pub. No.: WO2022/082849
PCT Pub. Date: Apr. 28, 2022

(65) Prior Publication Data
US 2022/0317363 A1    Oct. 6, 2022

(30) Foreign Application Priority Data
Oct. 22, 2020   (CN) .......................... 202011138491.8

(51) Int. Cl.
*F21V 8/00*    (2006.01)
*H05K 7/20*    (2006.01)
*G02F 1/1335*  (2006.01)
*G02F 1/1333*  (2006.01)

(52) U.S. Cl.
CPC ...... *G02B 6/0085* (2013.01); *G02F 1/133314* (2021.01); *G02F 1/133382* (2013.01); *G02F 1/133628* (2021.01); *H05K 7/2039* (2013.01); *G02B 6/0088* (2013.01)

(58) Field of Classification Search
CPC ............. H05K 7/20954; H05K 7/2039; H05K 7/20445; H05K 7/20454; G02F 1/133314; G02F 1/133382; G02F 1/133628
See application file for complete search history.

(56) References Cited

U.S. PATENT DOCUMENTS

2006/0221574 A1   10/2006  Song et al.
2011/0097962 A1    4/2011  Yuge
2016/0187567 A1    6/2016  Zhou
(Continued)

FOREIGN PATENT DOCUMENTS

| CN | 101008728 A  | 8/2007 |
| CN | 203223889 U  | 10/2013 |
| CN | 104566023 A  | 4/2015 |

(Continued)

*Primary Examiner* — Mariceli Santiago

(57) ABSTRACT

The present invention discloses a chip heat dissipation structure and a liquid crystal display device, and the chip heat dissipation structure includes: a chip contact end and a backplate contact end. The chip heat dissipation structure is made of thermal conductive material. The backplate is a backplate on a bottom of a backlight module in the liquid crystal display device. The present invention by conducting heat generated by the chip to the backplate lowers the increased temperature of the chip to solve the issue the heated surface of the liquid crystal display device.

16 Claims, 4 Drawing Sheets

(56) References Cited

U.S. PATENT DOCUMENTS

2017/0006738 A1\* 1/2017 Lee ................. H05K 1/148
2019/0049794 A1    2/2019 Liu

FOREIGN PATENT DOCUMENTS

| CN | 105759498 | A |   | 7/2016 |
|----|-----------|---|---|--------|
| CN | 106405913 | A |   | 2/2017 |
| CN | 106990611 | A |   | 7/2017 |
| CN | 206805058 | U |   | 12/2017 |
| CN | 206863402 | U |   | 1/2018 |
| CN | 107728362 | A |   | 2/2018 |
| CN | 207037286 | U |   | 2/2018 |
| CN | 108986681 | A |   | 12/2018 |
| CN | 209045054 | U |   | 6/2019 |
| CN | 16972622  | U |   | 12/2020 |
| KR | 20110051106 | A | \* | 5/2011 |
| KR | 20150078361 | A | \* | 7/2015 |
| KR | 20170071824 | A | \* | 6/2017 |

\* cited by examiner

CHIP HEAT DISSIPATION STRUCTURE AND LIQUID CRYSTAL DISPLAY DEVICE

FIELD OF INVENTION

The present invention relates to a field of display technologies, specifically relates to a chip heat dissipation structure and a liquid crystal display device.

BACKGROUND OF INVENTION

A liquid crystal display device has advantages of thin body, power saving, and radiation-free characteristic and is extensively used in various of occasions such as indoor display, outdoor display, or vehicle display. Most of conventional liquid crystal display devices in markets are backlight type and comprise a liquid crystal display panel and a backlight module. An operation principle of the liquid crystal display panel is that liquid crystal molecules are disposed between two parallel glass substrates, a drive voltage is applied to the two glass substrates to control orientations of liquid crystal molecules such that light emitted from the backlight module is refracted and re-directed to produce images. With reference to FIG. 1, FIG. 1 is a schematic structural view of a conventional liquid crystal display device. The liquid crystal display device 10 comprises a display panel 11, a backlight module 16, at least one chip (IC) 12, a double-sided tape 13, and a sealant frame (frame) 14. The backlight module 16 comprises: a backplate 166 located on a bottom of the backlight module 16, and a reflection plate 165, a light guide plate 164, an optical film 163 stacked sequentially on one another from bottom to top, and a light strip 161 and a heat conduction adhesive tape 162 located on a side of the backlight module 16. The chip 12 is disposed above the display panel 11 through a flexible printed circuit board (FPC) 15.

SUMMARY OF INVENTION

Technical Issue

A heat source of the liquid crystal display device usually comprises three portions: a light strip 161, a chip 12 and some elements. Internal heat concentrates in the liquid crystal display device and is gradually conducted to a surface of a screen to result in the hot screen. Heat dissipation technologies of the conventional liquid crystal display device usually aims at a light strip 161. However, with increasing demands of display devices of large screen and high brightness, a common heat dissipation method for a light strip 161 has become hardly solve the heat dissipation issue. Especially for a vehicle display device, with application of in-cell technologies on the vehicle display, a power consumption of the chip 12 increases such that an amount of heat generated by the chip 12 drastically increases, and the heat on a surface of the screen close to the chip 12 is specifically obvious.

Technical Solution

The embodiment of the present invention provides a chip heat dissipation structure and a liquid crystal display device aiming at solving an issue of poor chip heat dissipation effect in a conventional liquid crystal display device.

The present invention provides a chip heat dissipation structure, the chip heat dissipation structure comprises a chip contact end and a backplate contact end, the chip heat dissipation structure is made of thermal conductive material, the backplate is a backplate of a bottom of a backlight module under a display panel of a liquid crystal display device.

In some embodiments, the chip heat dissipation structure comprises:

a first surface serving as a chip contact end, located above the backlight module and the display panel, covering the chip, and contacting the chip in area;

a second surface serving as a backplate contact end, located under the backlight module and the display panel, paralleling the first surface, and contacting the backplate in area; and a third surface connected a side edge of the first surface opposite to the third surface.

In some embodiments, the first surface is located at an upper end of a printed circuit board in the liquid crystal display device.

In some embodiments, the second surface is located between a printed circuit board in the liquid crystal display device and the backplate.

In some embodiments, a gap is defined in the second surface and divides the second surface into two portions.

In some embodiments, the third surface comprises a hollow region, and in the liquid crystal display device a printed circuit board is partially in a range of the hollow region.

In some embodiments, the thermal conductive material is material with a thermal conductivity of 100 W/m·K.

In some embodiments, the thermal conductive material is selected from graphite or copper foil.

In some embodiments, a thickness of the chip heat dissipation structure is 0.03-0.2 mm.

The present invention also provides a chip heat dissipation structure, the chip heat dissipation structure comprises a chip contact end and a backplate contact end, the chip heat dissipation structure is made of thermal conductive material, the backplate is a backplate of a bottom of a backlight module under a display panel of a liquid crystal display device, wherein the chip heat dissipation structure comprises:

a first surface serving as a chip contact end, located above the backlight module and the display panel, covering the chip, and contacting the chip in area;

a second surface serving as a backplate contact end, located under the backlight module and the display panel, paralleling the first surface, and contacting the backplate in area; and a third surface connected a side edge of the first surface opposite to the third surface, the first surface is located at an upper end of a printed circuit board in the liquid crystal display device, and the second surface is located between a printed circuit board in the liquid crystal display device and the backplate.

In some embodiments, a gap is defined in the second surface and divides the second surface into two portions.

The present invention also provides a liquid crystal display device, comprising:

a backlight module;

a display panel disposed above the backlight module;

at least one chip electrically connected to the display panel; and at least one chip heat dissipation structure comprising an end serving as a chip contact end contacting the chip and another end serving as a backplate contact end contacting a backplate on a bottom of the backlight module, wherein the chip heat dissipation structure is made of thermal conductive material.

In some embodiments, the chip heat dissipation structure comprises:

a first surface serving as a chip contact end, located above the backlight module and the display panel, covering the chip, and contacting the chip in area;

a second surface serving as a backplate contact end, located under the backlight module and the display panel, paralleling the first surface, and contacting the backplate in area; and a third surface connected a side edge of the first surface opposite to the third surface.

In some embodiments, the first surface is located at an upper end of a printed circuit board in the liquid crystal display device.

In some embodiments, the second surface is located between a printed circuit board in the liquid crystal display device and the backplate.

In some embodiments, a gap is defined in the second surface and divides the second surface into two portions.

In some embodiments, the third surface comprises a hollow region, and in the liquid crystal display device a printed circuit board is partially in a range of the hollow region.

In some embodiments, the thermal conductive material is material with a thermal conductivity of 100 W/m·K.

In some embodiments, the thermal conductive material is selected from graphite or copper foil.

In some embodiments, a thickness of the chip heat dissipation structure is 0.03-0.2 mm.

Advantages

The present invention provides a chip heat dissipation structure and a liquid crystal display device. An end of the chip heat dissipation structure is a chip contact end contacting the chip, another end thereof is a backplate contact end contacting a backplate on a bottom of the backlight module. The chip heat dissipation structure is made of thermal conductive material. By conducting heat produced by the chip to the backplate, temperature of the chip is lowered to solve the issue of heat on surface of the liquid crystal display device, especially the vehicle display device.

Figure 1:
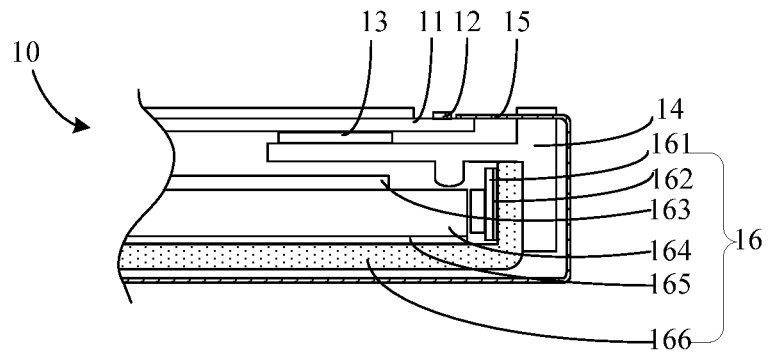
FIG. 1 is a schematic structural view of a conventional liquid crystal display device.

REFERENCE CHARACTERS (10, 20, 30)—display device; (11, 21)—display panel; (12, 22)—chip; (13, 23)—double-sided tape; (14, 24)—sealant frame; (15, 25)—printed circuit board; (16, 26)—backlight module; (161, 261)—light strip (162, 262)—heat conduction adhesive tape; (163, 263)—optical film; (164, 264)—light guide plate; (165, 265)—reflection plate; (166, 266)—backplate; 27—chip heat dissipation structure; 1—first surface; 2—second surface; 3—third surface; 211—gap.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

First, with reference to FIGS. 2 to 8, the embodiment of the present invention provides a chip heat dissipation structure 27. The chip heat dissipation structure 27 is disposed in a liquid crystal display device 20. An end of the chip heat dissipation structure 27 contacts at least one chip 22 and serves as a chip contact end 271, and another end thereof contacts a backplate 266 on a bottom of the backlight module 26 and serves as a backplate contact end 272. The chip heat dissipation structure 27 is made of thermal conductive material. The backplate 266 is a backplate 266 on a bottom of a backlight module 26 under a display panel 21 in a liquid crystal display device.

When the the chip heat dissipation structure 27 is a three dimensional structure, the chip heat dissipation structure 2 is U-shaped and comprises:

a first surface 1 serving as a chip contact end 271, located above the backlight module 26 and the display panel 21, covering the chip 22, and contacting the chip 22;

a second surface 2 serving as a backplate contact end 272, located under the backlight module 26 and the display panel 2, paralleling the first surface 1, and contacting the backplate 266 in area; and a third surface 3 connected to a side of the first surface 1 opposite to the third surface 3.

Specifically, the first surface 1 is located at an upper end of a printed circuit board 25 in the liquid crystal display device 20.

In an embodiment, the second surface 2 is located between a printed circuit board 25 in the liquid crystal display device 20 and the backplate.

In some embodiments, a gap 211 is defined in the second surface 2 and divides the second surface 2 into two portions to facilitate the chip heat dissipation structure 27 to be disposed around the printed circuit board 25 and attached to the backplate 266. The second surface 2 is disposed between thes printed circuit board 25 and the backplate 266. Therefore, the heat dissipation material can fully contact the backplate 266 to achieve heat dissipation effect.

Figure 2:
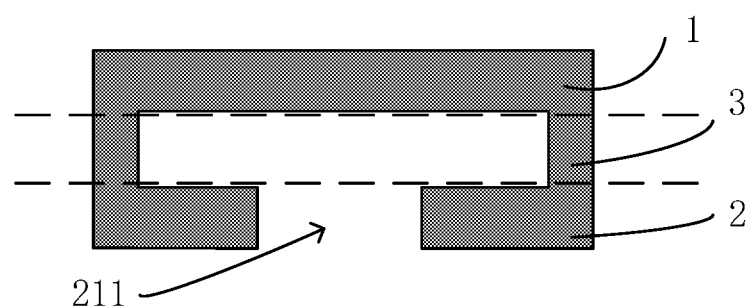
FIG. 2 is a schematic stretched structural view of the chip heat dissipation structure of the embodiment of the present invention.

With reference to FIG. 2, FIG. 2 is a schematic stretched structural view of the chip heat dissipation structure of the embodiment of the present invention. In FIG. 2, the third surface 3 comprises a hollow region configured to locate a portion of the printed circuit board 25 in the liquid crystal display device 20 in a range of the hollow region, an objective of which is to prevent heat conduction of the printed circuit board 25 to avoid influence of heat dissipation of the chip 22.

In some embodiments, the thermal conductive material is material with a thermal conductivity of 100 W/m·K or greater. In a specific embodiment, the material is selected from graphite or copper foil.

Specifically, a thickness of the chip heat dissipation structure 27 is 0.02-2 mm. It should be explained that the thickness refers to a thickness of the stretched chip heat dissipation structure 27. Preferably, the thickness is 0.03-0.2 mm, and under such condition, without influence to the thickness of the liquid crystal display device 20, a best thermal conduction is obtained.

The chip heat dissipation structure provided by the embodiment of the present invention, by conducting heat generated by the chip 22 to the backplate 266, lowers increased temperature of the chip 22 to solve the issue of heated surface of the liquid crystal display device 20, especially a vehicle liquid crystal.

The present invention also provides a liquid crystal display device 20, the liquid crystal display device 20 comprises: a backlight module 26, a display panel 21, at least one chip 22, and at least one chip heat dissipation structure 27. An end of the chip heat dissipation structure 27 contacts the chip 22 and serves as a chip contact end 271, and another end thereof contacts the backplate 266 on a bottom of the backlight module 26 and serves as a backplate contact end 272. The chip heat dissipation structure 27 is made of thermal conductive material.

Specifically, the backlight module 26 is located under the display panel 21 and comprises elements sequentially stacked on one another from bottom to top as follows: a backplate 266, a reflection plate 265, a light guide plate 264, an optical film 263, and a light strip 261 located on a side of the backlight module 26, and a heat conduction adhesive tape 262.

Specifically, a double-sided tape 23 and a sealant frame 24 are further included between the backlight module 26 and the display panel 21. The display panel 21 mainly comprises: a polarizer, a color filter substrate, and an array substrate. It can be understood that, except for the above structure, the embodiment of the present invention display panel 21 can also comprises any other necessary structures as needed, for example a substrate, a glass cover lid, etc., which is not limited specifically.

The display panel 21 can be divided in to a displaying region and a non-displaying region. The chip 22 is located in the non-displaying region, is electrically connected to the display panel 21, and is configured to drive the liquid crystal display panel to display screen images.

In an embodiment, the display device 20 further comprises a printed circuit board 25 electrically connected to the chip 22, is configured to load and transmit signals to the chip 22. The printed circuit board 25 has flexibility. In an embodiment, the printed circuit board 25 can from a front surface of the display panel 21 be sequentially disposed around sides of the display panel 21 and the backlight module 26 to a bottom surface of the backlight module 26.

Figure 3:
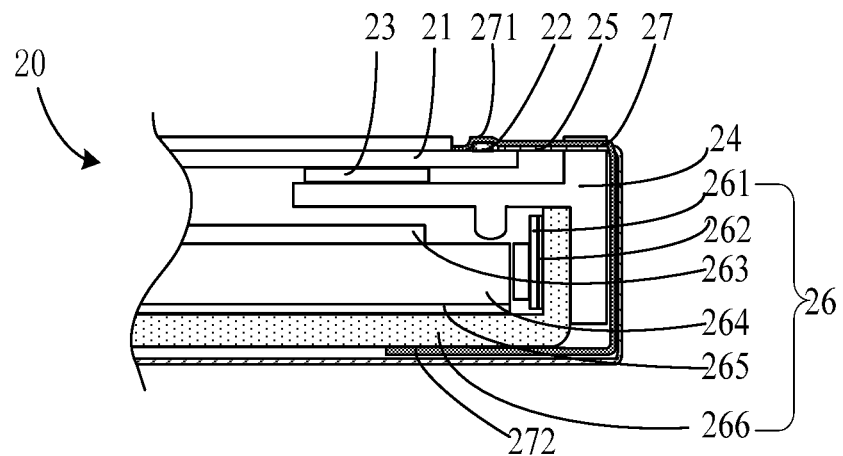
FIG. 3 is a schematic structural view of a liquid crystal display device provided by the embodiment of the present invention.

In an embodiment of the present invention, with reference to FIG. 3, FIG. 3 is a schematic structural view of a liquid crystal display device 20 provided by the embodiment of the present invention. The chip 22 is located above the non-displaying region of the display panel 21, the chip heat dissipation structure 27 is U-shaped and comprises:

a first surface 1 serving as a chip contact end 271, located above the backlight module 26 and the display panel 21, covering the chip 22, and contacting the chip 22 in area;

a second surface 2 serving as a backplate contact end 272, located under the backlight module 26 and the display panel 21, paralleling the first surface 1, and contacting the backplate 266 in area; and a third surface 3 connected to a side of the first surface 1 opposite to the third surface 3.

The liquid crystal display device 20 provided by the embodiment of the present invention, disposes the chip heat dissipation structure 27 on the liquid crystal display device 20, lowers the increased temperature of the chip 22 by conducting heat generated by the chip 22 to the backplate 266 to solve the issue of heated surface of the liquid crystal display device 20, especially a vehicle liquid crystal display device.

Figure 4:
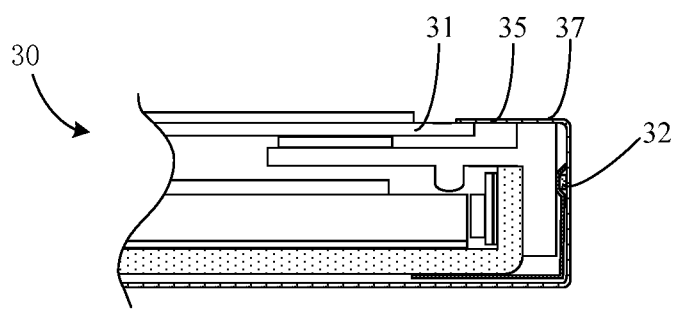
FIG. 4 is a schematic structural view of another liquid crystal display device provided by the embodiment of the present invention.

In another embodiment of the present invention, a difference thereof from the above embodiment is that the chip 32 is located a side of the display panel 31 through the printed circuit board 35. With reference to FIG. 4, the chip heat dissipation structure 37 of the liquid crystal display device 30 is L-shaped and comprises:

a first surface located on sides of the backlight module and the display panel 31, covering the chip 32, and contacting the chip 32 in area; and a second surface located under the backlight module and the display panel 31 and perpendicularly connected to the first surface.

Figure 5:
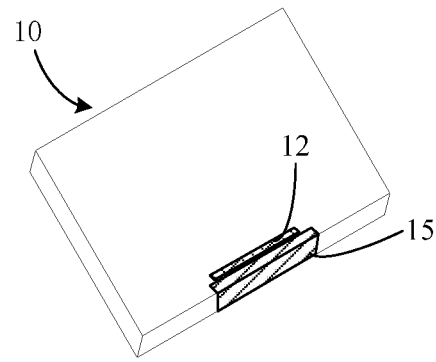
FIG. 5 is a schematic perspective structural view of a conventional liquid crystal display device.
Figure 6:
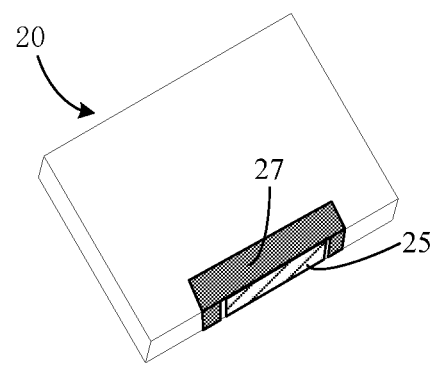
FIGS. 6 and 7 are schematic perspective structural views of a liquid crystal display device provided by the embodiment of the present invention.
Figure 7:
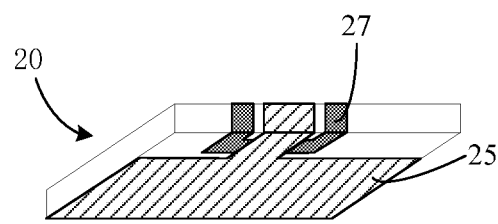

In another embodiment of the present invention. With reference to FIGS. 5 to 7, FIG. 5 is a schematic perspective structural view of a conventional liquid crystal display device 20, the chip 22 is located above a non-displaying region of the display panel 21, the printed circuit board 25 is electrically connected to the chip 22 and is located above the non-displaying region of the display panel 21, on sides of the display panel 21 and the backlight module 26, and on a bottom surface of the backlight module 26. FIGS. 6 and 7 are schematic perspective structural views of a liquid crystal display device 20 provided by the embodiment of the present invention, and the chip heat dissipation structure 27 covers the chip 22, is disposed around sides of the display panel 21 and the backlight module 26 to the bottom surface of the backlight module 26. A hollow region is defined in a portion of the chip heat dissipation structure 27 on the sides of the display panel 21 and the backlight module 26, and a portion of the printed circuit board 25 is located in a range of the hollow region.

Because the printed circuit board 25 is sensitive to a bending stress, the bending stress would influence an optical effect of the display panel 21. The embodiment of the present invention, by defining the hollow region in the second surface 2 to bypass the printed circuit board 25, prevents a curved portion of the chip heat dissipation structure 27 from generating a bending stress on the printed circuit board 25 to further avoid influence to the optical effect of the display panel 21. In another aspect, because the printed circuit board 25 itself has heat generating elements that would also produce heat, heat conduction from the printed circuit board 25 is required to be avoided to prevent influence to heat dissipation of the chip 22. Furthermore, the printed circuit board 25 itself has a heat dissipation mechanism for example, heat radiation through ambient environment. If the chip heat dissipation structure 27 does not avoid the the printed circuit board 25, the heat dissipation effect of the printed circuit board 25 will also be affected.

Figure 8:
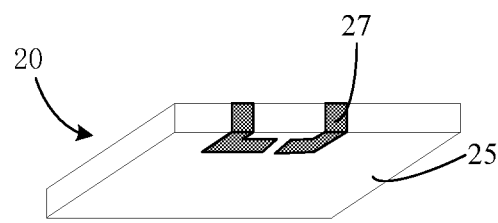
FIG. 8 is a schematic perspective structural view of a liquid crystal display device provided by the embodiment of the present invention with the printed circuit board removed.

In another embodiment of the present invention, FIG. 8 is a schematic perspective structural view of a liquid crystal display device 20 provided by the embodiment of the present invention with the printed circuit board 25 removed for convenience of viewing the chip heat dissipation structure 27 shielded by the printed circuit board 25. With reference to FIG. 7, a gap 211 is defined in the second surface 2 for convenience that the chip heat dissipation structure 27 extend around the printed circuit board 25 to be reversely attached to the backplate 266. The second surface 2 is located between the printed circuit board 25 and the backplate 266 such that the heat dissipation material fully contacts the backplate 266 to achieve heat dissipation effect.

Generally, material of the chip heat dissipation structure 27 is thermal conductive material, for example material with a thermal conductivity of 100 W/m·K or greater. In some specific embodiment, a thermal conductivity of the thermal conductive material is 120-380 W/m·K. In some specific embodiment, the thermal conductive material is graphite and/or copper foil.

In the present invention, thermal conductivity comprises definitions as known in the art, and refers that under a stable thermal conduction condition, a difference of temperatures of two sides of material with a thickness of 1 m is 1 degree (K, ° C.). In a time period, heat transmitted through an area of 1 m2, and a unit of the thermal conductivity is W/(m·K). The thermal conductivity of the material of the present invention can be a thermal conductivity of material known in the art, or can be measured according to methods of ASTM D5470 or ISO 22007-2:2015. The objective of the present invention can be achieved as long as the thermal conductivity measured by any one of methods is within a range of the present invention.

In the above-mentioned embodiments, the descriptions of the various embodiments are focused. For the details of the embodiments not described, reference may be made to the related descriptions of the other embodiments.

In specific implementation, each of the above units or structures may be implemented as a separate entity, or may be any combination, and implemented as the same entity or a plurality of entities. The specific implementation of the above units or structures refer to the previous method embodiment and will not be described repeatedly.

The liquid crystal display device 20 and the chip heat dissipation structure 27 provided by the embodiment of the present invention are described in detail. In the specification, the specific examples are used to explain the principle and embodiment of the present invention. The above description of the embodiments is only used to help understand the method of the present invention and its spiritual idea. Meanwhile, for those skilled in the art, according to the present the idea of invention, changes will be made in specific embodiment and application. In summary, the contents of this specification should not be construed as limiting the present invention.

What is claimed is:

1. A chip heat dissipation structure, wherein the chip heat dissipation structure comprises a chip contact end and a backplate contact end, the chip heat dissipation structure is made of thermal conductive material, the backplate is a backplate of a bottom of a backlight module under a display panel of a liquid crystal display device;

wherein the chip heat dissipation structure comprises:
 a first surface serving as a chip contact end, located above the backlight module and the display panel, covering the chip, and contacting the chip in area;
 a second surface serving as a backplate contact end, located under the backlight module and the display panel, paralleling the first surface, and contacting the backplate in area; and
 a third surface connected a side edge of the first surface opposite to the third surface;
wherein a gap is defined in the second surface and divides the second surface into two portions.

2. The chip heat dissipation structure as claimed in claim 1 wherein the first surface is located at an upper end of a printed circuit board in the liquid crystal display device.

3. The chip heat dissipation structure as claimed in claim 1 wherein the second surface is located between a printed circuit board in the liquid crystal display device and the backplate.

4. The chip heat dissipation structure as claimed in claim 1 wherein the third surface comprises a hollow region, and in the liquid crystal display device a printed circuit board is partially in a range of the hollow region.

5. The chip heat dissipation structure as claimed in claim 1, wherein the thermal conductive material is material with a thermal conductivity of 100 W/mK.

6. The chip heat dissipation structure as claimed in claim 5, wherein the thermal conductive material is selected from graphite or copper foil.

7. The chip heat dissipation structure as claimed in claim 1, wherein a thickness of the chip heat dissipation structure is 0.03-0.2 mm.

8. A chip heat dissipation structure, wherein the chip heat dissipation structure comprises a chip contact end and a backplate contact end, the chip heat dissipation structure is made of thermal conductive material, the backplate is a backplate of a bottom of a backlight module under a display panel of a liquid crystal display device, wherein the chip heat dissipation structure comprises:
 a first surface serving as a chip contact end, located above the backlight module and the display panel, covering the chip, and contacting the chip in area;
 a second surface serving as a backplate contact end, located under the backlight module and the display panel, paralleling the first surface, and contacting the backplate in area; and
 a third surface connected a side edge of the first surface opposite to the third surface, the first surface is located at an upper end of a printed circuit board in the liquid crystal display device, and the second surface is located between a printed circuit board in the liquid crystal display device and the backplate;

wherein a gap is defined in the second surface and divides the second surface into two portions.

9. A liquid crystal display device, comprising:

a backlight module;

a display panel disposed above the backlight module;

at least one chip electrically connected to the display panel; and at least one chip heat dissipation structure comprising an end serving as a chip contact end contacting the chip and another end serving as a backplate contact end contacting a backplate on a bottom of the backlight module, wherein the chip heat dissipation structure is made of thermal conductive material;

wherein a gap is defined in the second surface and divides the second surface into two portions.

10. The liquid crystal display device as claimed in claim 9, wherein the chip heat dissipation structure comprises:

a first surface serving as a chip contact end, located above the backlight module and the display panel, covering the chip, and contacting the chip in area;

a second surface serving as a backplate contact end, located under the backlight module and the display panel, paralleling the first surface, and contacting the backplate in area; and a third surface connected a side edge of the first surface opposite to the third surface.

11. The liquid crystal display device as claimed in claim 10, wherein the first surface is located at an upper end of a printed circuit board in the liquid crystal display device.

12. The liquid crystal display device as claimed in claim 10, wherein the second surface is located between a printed circuit board in the liquid crystal display device and the backplate.

13. The liquid crystal display device as claimed in claim 10, wherein the third surface comprises a hollow region, and in the liquid crystal display device a printed circuit board is partially in a range of the hollow region.

14. The liquid crystal display device as claimed in claim 9, wherein the thermal conductive material is material with a thermal conductivity of 100 W/m·K.

15. The liquid crystal display device as claimed in claim 14, wherein the thermal conductive material is selected from graphite or copper foil.

16. The liquid crystal display device as claimed in claim 9, wherein a thickness of the chip heat dissipation structure is 0.03-0.2 mm.

* * * * *